(12) United States Patent
Okihara

(10) Patent No.: US 7,205,190 B2
(45) Date of Patent: Apr. 17, 2007

(54) SEMICONDUCTOR DEVICE FABRICATION METHOD

(75) Inventor: Masao Okihara, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 76 days.

(21) Appl. No.: 10/963,835

(22) Filed: Oct. 14, 2004

(65) Prior Publication Data

US 2005/0176184 A1 Aug. 11, 2005

(30) Foreign Application Priority Data

Feb. 10, 2004 (JP) .............................. 2004-033106

(51) Int. Cl.
*H01L 21/8238* (2006.01)
(52) U.S. Cl. ..................... 438/233; 438/219; 438/256; 438/251; 257/506; 257/E21.545
(58) Field of Classification Search ................ 438/233, 438/251, 256, 219; 257/506, E21.545
See application file for complete search history.

(56) References Cited

U.S. PATENT DOCUMENTS

| | | | | |
|---|---|---|---|---|
| 5,138,409 | A * | 8/1992 | Kawai | 257/327 |
| 6,303,414 | B1 * | 10/2001 | Ang et al. | 438/155 |
| 6,355,511 | B1 * | 3/2002 | Lukanc et al. | 438/152 |
| 6,372,562 | B1 * | 4/2002 | Matsumoto | 438/164 |
| 6,632,710 | B2 | 10/2003 | Takahashi | |
| 2002/0089031 | A1 * | 7/2002 | Ang et al. | 257/506 |
| 2002/0185687 | A1 * | 12/2002 | Koh et al. | 257/347 |
| 2003/0089948 | A1 * | 5/2003 | Min | 257/347 |

FOREIGN PATENT DOCUMENTS

| | | |
|---|---|---|
| JP | 08-172174 | 7/1996 |
| JP | 08-316348 | 11/1996 |
| JP | 2000-243967 | 9/2000 |
| JP | 2002-190521 | 7/2002 |
| JP | 2003-218356 | 7/2003 |

OTHER PUBLICATIONS

Ghandhi S. K, VLSI Fabrication Principles: Silicon and Gallium Arsenide 2nd edition, Wiley-Interscience, pp. 395-398, 731-733, 1994.*

* cited by examiner

*Primary Examiner*—George Fourson
*Assistant Examiner*—John M. Parker
(74) *Attorney, Agent, or Firm*—Rabin & Berdo, P.C.

(57) ABSTRACT

The present invention adequately activates a substrate contact region of a support substrate without substantially changing the conventional SOI-CMOS device formation process. An exposed face of the support substrate is formed in an element isolation region of a layered substrate, which includes a support substrate having a first semiconductor layer, an insulating layer provided on the support substrate, and a second semiconductor layer provided on the insulating layer, by etching away the insulating layer and the second semiconductor layer. A substrate contact region is then formed in the support substrate by performing ion implantation from the side of the exposed face of the support substrate. Thereafter, an element isolation insulation layer is formed on the exposed face of the support substrate and a gate oxide film and a gate electrode are formed on the remaining second semiconductor layer. In addition, drain and source regions are formed by performing the ion implantation to the remaining second semiconductor layer with the gate electrode serving as a mask. Annealing to activate the substrate contact region, the drain region and the source region is then performed. Thereafter, a metal layer with a high melting point is formed on the drain and source regions and the metal layer is silicided through heat treatment.

20 Claims, 6 Drawing Sheets

SUBSTRATE CONTACT REGION FORMATION STEP (1)

SUBSTRATE CONTACT REGION FORMATION STEP (2)

MOSFET FORMATION STEP

CONTACT FORMATION STEP

CONVENTIONAL SUBSTRATE CONTACT FORMATION METHOD (1)

CONVENTIONAL SUBSTRATE CONTACT FORMATION METHOD (2)

SEMICONDUCTOR DEVICE FABRICATION METHOD

BACKGROUND OF THE INVENTION

1. Field of the Invention

The invention relates to a semiconductor device fabrication method and, more particularly, to a substrate contact formation method.

2. Description of the Related Art

Due to advances in CMOS technology of recent years, the functions of CMOS devices employing bulk Si substrates are improving rapidly. Therefore, applications of CMOS technology in higher frequency regions of the GHz band, which have been conventionally problematic, are becoming feasible. When CMOS technology is applied to high frequency circuits, in such cases the combined mounting of digital and analog circuits may be considered, the performance of the analog circuit is known to deteriorate due to crosstalk noise from the digital circuit.

As compared with a CMOS device employing a bulk Si substrate, an SOI-CMOS device employs an SOI (Silicon On Insulator) substrate which has an insulating layer between a support substrate and an element region. Accordingly, those elements which are formed on the same substrate are completely isolated with respect to each other by means of a buried oxide film, i.e., the insulating layer, which extends below the element region, thereby suppressing crosstalk noise from the digital circuit.

In addition, because a high-resistance Si substrate can be easily adopted as the support substrate in the SOI device, high-frequency signal loss can be suppressed in a passive element such as an on-chip capacitor or an inductor.

In cases where an SOI device is applied to a high-frequency circuit, it is essential to fix the potential of the support substrate at ground potential. This is because, when a noise enters the support substrate, there is a risk that characteristics of the SOI-CMOS device fluctuate under the influence of the noise and that the performance of the analog circuit deteriorates. As a countermeasure against above risk, a method to keep the support substrate at ground potential is generally adopted, which is achieved by forming a substrate contact (See Japanese Patent Application Kokai Nos. 2002-190521, 2000-243967, and 2003-218356, for example). Thus, a conventional formation method of the substrate contact will be described with reference to FIGS. 5 and 6.

First, a CMOS is formed on an SOI substrate by means of a well-known SOI-CMOS fabrication method (See FIG. 5A). Although the CMOS consists of two types of MOSFETs, only one MOSFET (a p-type MOSFET, for example) is shown, but the other MOSFET (an n-type MOSFET, for example) is not shown hereinafter. The SOI substrate includes a support substrate 210, a buried oxide film 220 which is an insulating layer provided on the support substrate 210, and a silicon layer 230 provided on the buried oxide film 220. The silicon layer 230 is isolated from other elements (not shown) provided on the substrate by means of an element isolation insulating layer 252.

In the silicon layer 230, a gate region 234, a drain region 236 and a source region 238 are formed. A drain electrode 286 and a source electrode 288 which are made from a metal silicide using a metal such as cobalt are formed on the drain region 236 and source region 238 of the silicon layer 230, respectively. A gate oxide film 264 is provided on the gate region 234, and a gate electrode 274 is formed on the gate oxide film 264.

Next, an interlayer insulating film 290 is formed on the MOSFET formed in the silicon layer 230 and on the element isolation insulating layer 252. The interlayer insulating film 290 is formed by means of a CVD method, for example (See FIG. 5B).

Next, contact holes are provided above the MOSFET formed on the silicon layer 230 by photolithographically etching the interlayer insulating film 290. The contact holes are provided in positions that correspond with the gate electrode 274, the drain electrode 286 and the source electrode 288, respectively. FIG. 5C shows, by way of example, a drain contact hole 296 provided above the drain electrode 286 and a source contact hole 298 provided above the source electrode 288. In addition, a substrate contact hole 292 is provided by photolithographically etching the interlayer insulating film 290, the element isolation insulating layer 252 and the buried oxide film 220 (see FIG. 5C).

Next, in order to reduce a contact resistance, impurity is introduced into the support substrate via the substrate contact hole 292. Accordingly, a substrate contact region 212 is formed to be a high-density impurity diffusion region (see FIG. 6A). In cases where the substrate contact region 212 is a p-type contact region, p-type impurity such as $BF_2$ or B is introduced and, when the substrate contact region 212 is an n-type contact region, n-type impurity such as As or P is introduced. Thereafter, annealing is performed to activate the substrate contact region 212.

Next, the drain contact hole 296, the source contact hole 298, the gate contact hole (not shown), and the substrate contact hole 292 are filled with tungsten (W) or the like by means of the CVD method so as to form a drain plug 306, a source plug 308, a gate plug (not shown), and a substrate contact plug 302, respectively (see FIG. 6B).

Next, metal (aluminum, for example) wiring is formed on the interlayer insulating film 290 by means of a sputtering method so as to provide a drain wiring 316, a source wiring 318, a gate wiring (not shown), and a substrate wiring 312 (see FIG. 6C). The drain electrode 286 is connected externally via the drain plug 306 and the drain wiring 316, the source electrode 288 is connected externally via the source plug 308 and the source wiring 318, and the gate electrode 274 is connected externally via the gate plug (not shown) and the gate wiring (not shown). The substrate contact region 212 is connected externally via the substrate contact plug 302 and the substrate wiring 312 and is normally held at ground potential.

In SOI device fabrication, a resistance between the substrate contact region and the substrate contact plug (hereinafter also referred to as a contact resistance) must be made low in order to hold the support substrate at ground potential.

In order to reduce the contact resistance, the substrate contact region is doped with impurity by ion implantation. After the ion implantation, annealing is required to activate the impurity. However, when annealing is performed at a temperature of 800° C. or more, adverse effects such as the aggregation of metal silicide formed as the drain electrode 286 and the source electrode 288 occur. On the other hand, in order to activate the substrate contact region adequately and reduce the contact resistance, annealing at a temperature of 1000° C. or more is required, which means annealing at a temperature of 800° C. or less is inadequate. As a result, a low contact resistance is not achieved.

Because the substrate contact hole must be formed deeply, the aspect ratio thereof becomes high and it is therefore sometimes impossible to perform adequate ion implantation in the substrate contact region. Therefore, a plug made from polycrystalline silicon is formed on the substrate contact region in order to reduce the aspect ratio of the substrate contact hole, which is disclosed in Japanese Patent Application Kokai No. 2002-190521.

On the other hand, in order to reduce the number of steps to introduce the impurity, the impurity introduction to the substrate contact region via the substrate contact hole is performed simultaneously with the impurity introduction to the source and drain regions of the MOSFET, which is disclosed in Japanese Patent Application Kokai Nos. 2000-243967 and 2003-218356.

However, in Japanese Patent Application Kokai No. 2002-190521, a step of forming a polycrystalline silicon layer in the substrate contact region is additionally required. Further, in Japanese Patent Application Kokai Nos. 2000-243967 and 2003-218356, a step of forming an opening for substrate contact formation is required after the formation of an element isolation region. As described above, the step to achieve the low contact resistance is complex in any conventional technology.

SUMMARY OF THE INVENTION

An object of the invention is to provide a fabrication method for a semiconductor device and, more particularly, an SOI device, which forms an adequately activated substrate contact in the substrate contact region of a support substrate without substantially changing the conventional SOI-CMOS device formation process.

A semiconductor device fabrication method according to a first aspect of the invention includes the following steps. First, a support substrate consisting of a first semiconductor layer, an insulating layer provided on the support substrate and a layered substrate with a second semiconductor layer provided on the insulating layer are prepared. Subsequently, the layered substrate is provided with an element formation region and an element isolation region that surrounds the element formation region, and then a mask that covers the element formation region and exposes the element isolation region is formed on the layered substrate.

Next, respective regions of the insulating layer and second semiconductor layer that are included in the element isolation region are etched away by using the above-described mask, thereby the layered structure of the remaining insulating layer and the remaining second semiconductor layer are formed in the element formation region and the exposed face of the support substrate is formed in the element isolation region. In addition, a substrate contact region is formed in the support substrate by performing ion implantation using the abovedescribed mask from the exposed surface side of the support substrate.

Next, an element isolation insulating layer surrounding the layered structure is formed on the exposed face of the support substrate. In addition, a gate electrode is formed via a gate oxide film on the remaining second semiconductor layer following removal of the abovedescribed mask.

Thereafter, a drain region and source region are formed by performing ion implantation to the remaining second semiconductor layer with the gate electrode serving as the mask. Annealing to activate the substrate contact region, the drain region and the source region is then simultaneously performed. In addition, after forming a metal layer with a high melting point on the drain and source regions, the metal layer is converted into a silicide by executing heat treatment.

In the implementation of the semiconductor device fabrication method of this invention, the second semiconductor layer is preferably silicon and the layered substrate is preferably an SOI substrate.

According to the semiconductor device fabrication method of this invention, when the element isolation region is etched away, etching is performed until the support substrate is exposed and ion implantation is performed on the substrate contact region following the etching of the element isolation region. It is thus possible to omit the step of providing the element isolation insulating layer with an opening for performing ion implantation into the substrate contact region. Specifically, the substrate contact region can be formed simply by adding a step of ion-implantation of impurity before the normal step of forming the element isolation insulating layer.

Further, ion implantation to form the substrate contact region is executed before providing a metal layer with a high melting point on the drain and source regions and siliciding the metal layer, and activation annealing of the substrate contact region can be performed simultaneously with the activation annealing of the drain and source regions. Accordingly, a low-resistance substrate contact can be formed.

By applying the above semiconductor device fabrication method to an SOI substrate, an adequately activated substrate contact region can be formed in the substrate contact region of the support substrate without substantially changing the conventional SOI-CMOS device formation process.

DETAILED DESCRIPTION OF THE INVENTION

An embodiment of a semiconductor device fabrication method according to the invention will be described with reference to FIGS. 1A to 1D. It should be noted that the constitution and positional relationships of the embodiment are merely shown schematically to an extent necessary for an understanding of the invention. Further, although a preferred embodiment of the invention will be described hereinbelow, the composition (materials) of each constitution and the numerical conditions thereof and so forth are only preferred examples. Therefore, the invention is in no way limited to or by the following embodiment.

The semiconductor device fabrication method of the embodiment of the invention includes three steps, which are a substrate contact region formation step, a MOSFET formation step, and a contact formation step, as described hereinbelow. Each step includes a plurality of sub-steps.

The substrate contact region formation step will now be described with reference to FIGS. 1A to 1D and 2A and 2B. The substrate contact region formation step includes sub-steps (a) to (f), which are described hereinbelow. FIGS. 1A to 1D and 2A to 2B are step diagrams to illustrate the substrate contact region formation step.

Figure 1A:
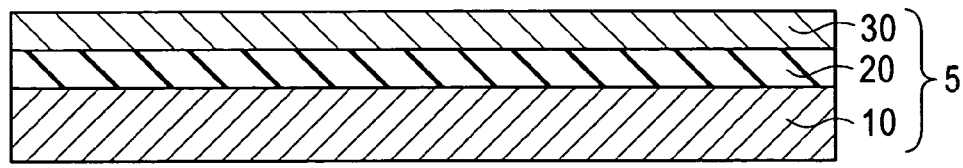
FIGS. 1A to 1D are step diagrams to illustrate a substrate contact region formation step (1)
Figure 1B:
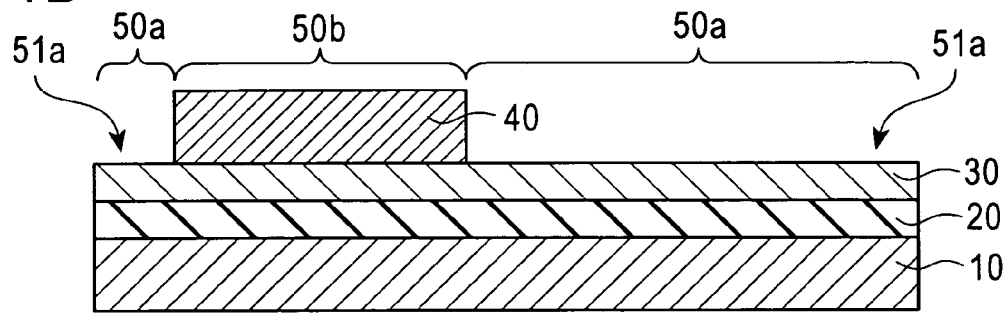
Figure 1C:
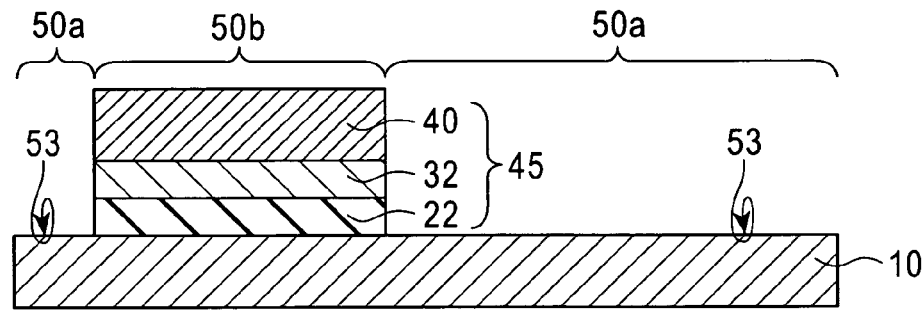
Figure 1D:
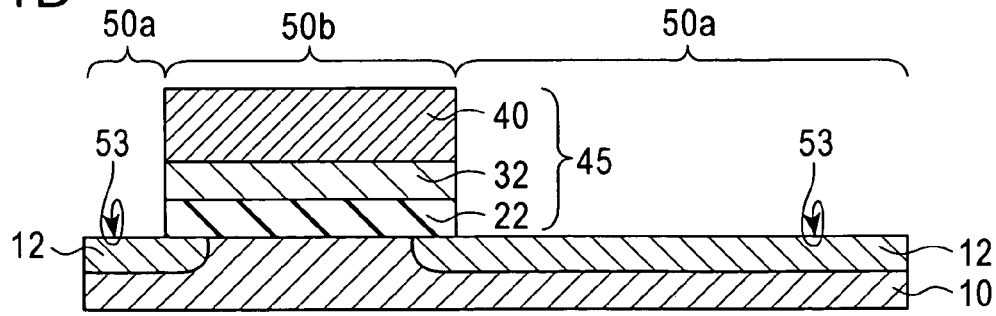
Figure 2A:
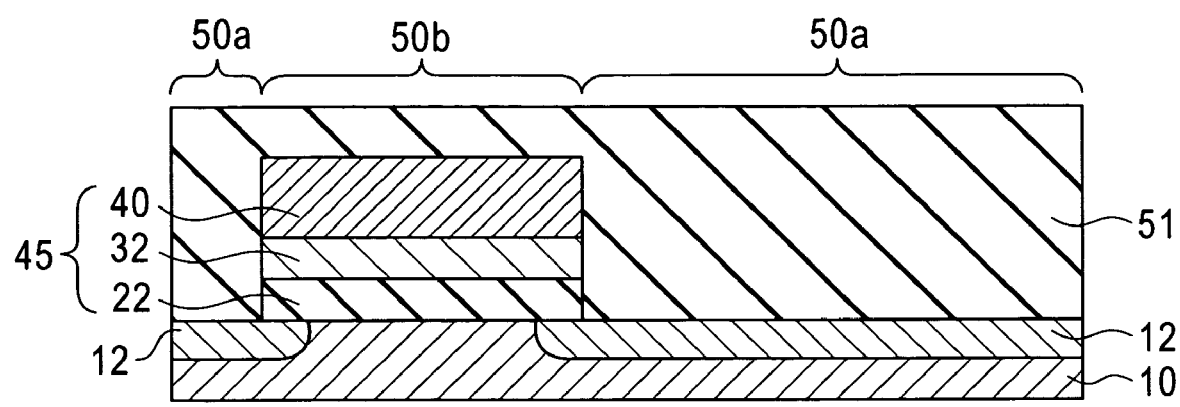
FIGS. 2A and 2B are step diagrams to illustrate a substrate contact region formation step (2)
Figure 2B:
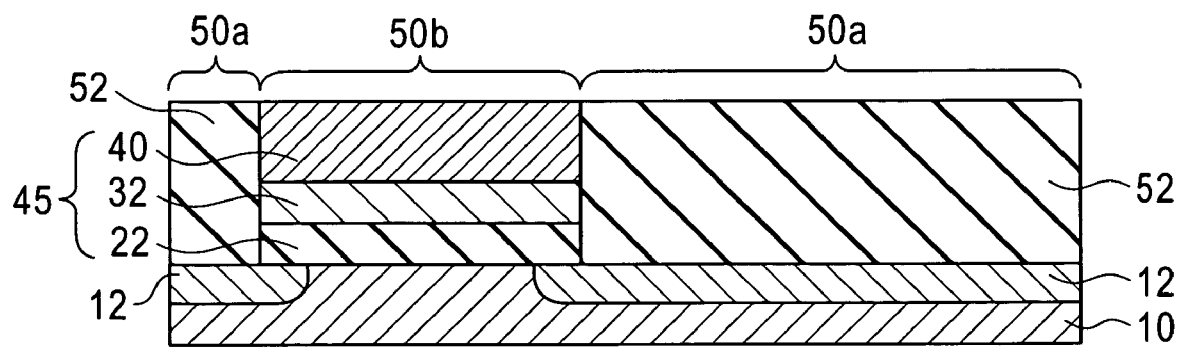
Figure 3A:
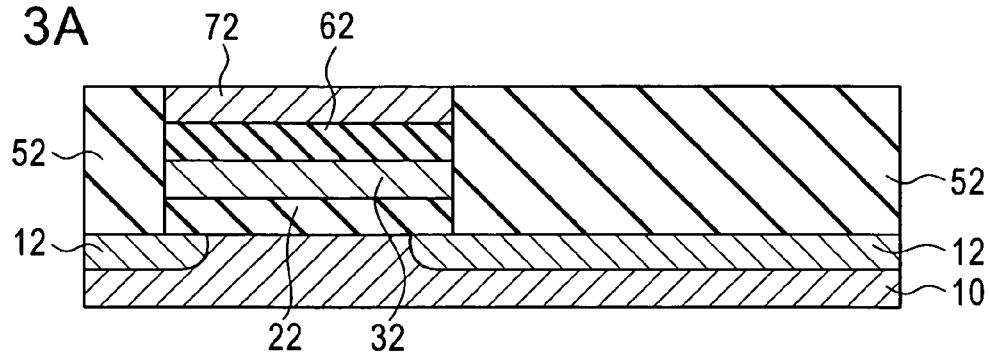
FIGS. 3A to 3D are step diagrams to illustrate a MOSFET formation step.
Figure 3B:
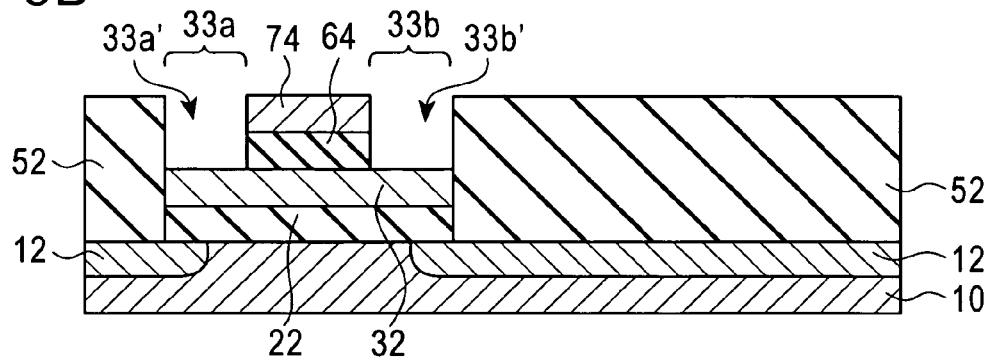
Figure 3C:
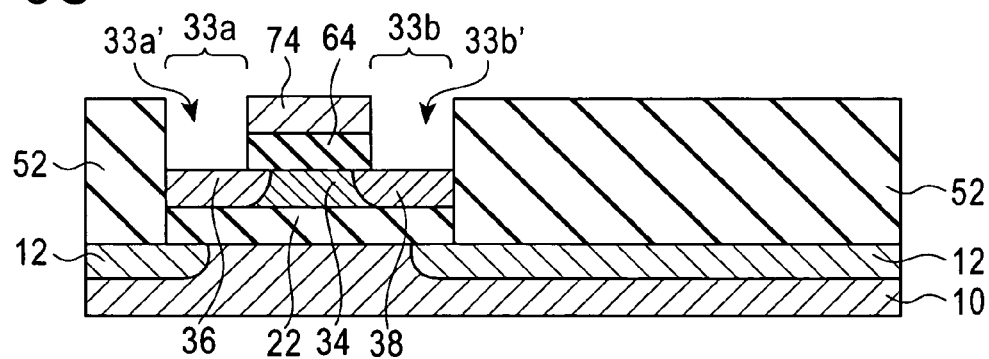
Figure 3D:
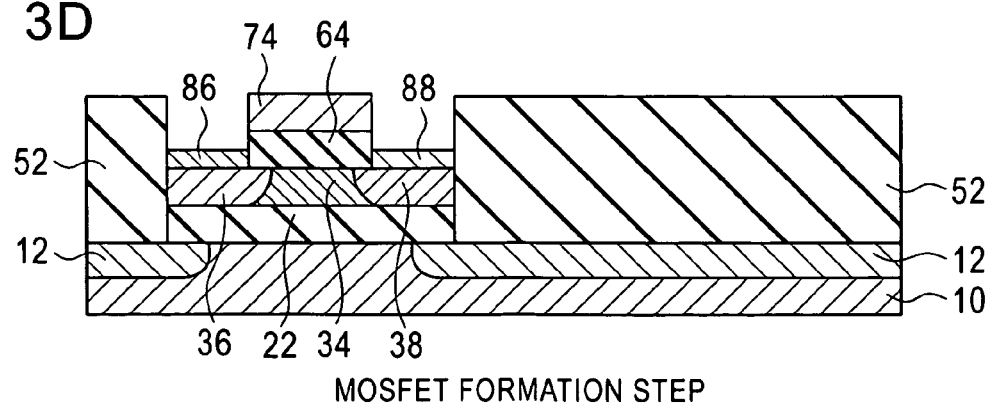

In a sub-step (a), a layered substrate 5 is provided which includes a support substrate 10 as a first semiconductor layer, an insulating layer 20 provided on the first semiconductor layer 10, and a second semiconductor layer 30 provided on the insulating layer 20 (see FIG. 1(A)). When an SOI (Silicon On Insulator) substrate is employed as the layered substrate 5, the insulating layer 20 is formed by a buried oxide film and the second semiconductor layer 30 is formed by a silicon layer. The SOI substrate may be formed by means of well-known methods, such as a SIMOX method or a bonded method. When either of these methods is used, the support substrate 10 is also formed from a silicon layer. The following embodiment will be described based on the layered substrate, i.e., an SOI substrate, formed by the SIMOX method or the bonded method.

In a sub-step (b), an etching mask 40 is formed on the second semiconductor layer 30 of the layered substrate 5. The etching mask 40 is formed by patterning a silicon nitride film that is formed on the second semiconductor layer 30. The etching mask 40 covers an element formation region 50b provided on the layered substrate 5 and has a shape with an opening 51a for exposure of a trench region 50a in which an element isolation region will be formed (see FIG. 1B). The trench region 50a is provided so as to surround the element formation region 50b.

In a sub-step (c), the trench region 50a is etched away (hereinafter also referred to as trench etching). Trench etching is executed by using any suitable etching technology such as reactive ion etching (RIE) that uses the etching mask 40, such that the trench region 50a of the layered substrate 5 is etched away. At this time, not only the second semiconductor layer 30 but also the insulating layer 20 is etched away, such that an exposed face 53 is formed in the support substrate 10. Here, the exposed face 53 denotes the surface itself of the support substrate 10, a face that appears after the surface of the support substrate 10 is etched away, or the surface of the insulating layer 20 that is thin enough to allow impurity to be ion implanted to the support substrate 10. As a result of the trench etching of the sub-step (c), a part of insulating layer 22 and a part of second semiconductor layer 32 in the element formation region 50b remain, thereby forming the layered structure 45. In the following description, the remaining part of the second semiconductor layer is simply referred to as a remaining second semiconductor layer 32 and the remaining part of the insulating layer is simply referred to as a remaining insulating layer 22 (see FIG. 1C).

In a sub-step (d), the support substrate 10, with the etching mask 40 remains as is, is heavily doped with impurity by ion implantation from the side of the exposed face 53 of the support substrate 10. As a result of the ion implantation, a substrate contact region 12 which is a high-density impurity diffusion region is formed in the support substrate 10 (see FIG. 1D). The impurity is introduced at a density of about 1 to $5 \times 10^{15}$ ions/cm$^2$. When the substrate contact region is a p-type region, p-type impurity such as BF$_2$ or B is introduced and, when the substrate contact region is an n-type region, n-type impurity such as As or P is introduced.

In a sub-step (e), an insulating film 51 is formed on the etching mask 40 and on the exposed face of the substrate contact region 12 of the support substrate 10 which corresponds to the part indicated by the reference numeral 53 in FIG. 1. The insulating film 51 is formed by depositing a silicon oxide film by means of a CVD method, for example (see FIG. 2A).

In a sub-step (f), an upper face of the insulating film 51 is leveled by means of any suitable polishing technique such as CMP (Chemical Mechanical Polishing). This polishing is performed to a level where an upper face of the etching mask 40 is exposed. As a result of this leveling process, an element isolation insulating layer 52 is formed in the trench region 50a so as to surround the layered structure 45 formed in the element formation region 50b (see FIG. 2B).

Next, the MOSFET formation step will be described with reference to FIGS. 3A to 3D. The MOSFET formation step includes sub-steps (g) to (j), which are described hereinbelow. FIGS. 3A to 3D are step diagrams to illustrate the MOSFET formation step.

In a sub-step (g), the etching mask corresponding to the part indicated by the reference numeral 40 in FIGS. 1 and 2 is removed. A silicon oxide film 62 is formed by means of a thermal oxidation or the like on the remaining second semiconductor layer 32 that is exposed as a result of the removal of the etching mask. In addition, a polycrystalline silicon layer 72 is formed on the silicon oxide film 62 by means of a Chemical Vapor Deposition (CVD) method (See FIG. 3A).

In a sub-step (h), a resist layer (not shown) is formed on the polycrystalline silicon layer 72 with a resist pattern (not shown) having openings in areas corresponding to a drain formation region 33a and a source formation region 33b. By etching with a mask of the resist pattern, the polycrystalline silicon layer 72 and the silicon oxide film 62 in the drain formation region 33a and the source formation region 33b are etched away. Thus, openings 33a' and 33b' are formed and a gate electrode 74 and a gate oxide film 64 are formed in a remaining part interposed between the openings 33a' and 33b' (see FIG. 3B).

It should be noted that a metal such as aluminum may be used as the material of the gate electrode, even though polycrystalline silicon is used in this embodiment.

In a sub-step (i), the drain formation region 33a and source formation region 33b are heavily doped with impurity by ion implantation via openings 33a' and 33b' with the gate electrode 74 serving as a mask. For example, when a p-type MOSFET is formed, p-type impurity such as BF$_2$ or B is introduced and, when an n-type MOSFET is formed, n-type impurity such as As or P is introduced. As a result of the impurity introduction, a drain region 36 and a source region 38 are formed in the drain formation region 33a and source formation region 33b of the remaining second semiconductor layer 32, respectively. A part below the gate electrode 74 and the gate oxide film 64 of the remaining second semiconductor layer 32 thus becomes a gate region 34 (see FIG. 3C). Following the ion implantation, the resist is removed. Thereafter, the substrate is annealed at a temperature of 1000° C. or more to activate the drain region 36 and source region 38. At this time, the substrate contact region 12 is also activated simultaneously.

In a sub-step (j), following the formation of a metal layer with a high melting point such as cobalt on the drain region 36 and source region 38, heat treatment is performed to convert the metal layer into a metal silicide. The metal silicide thus formed on the drain region 36 and source region 38 is used as a drain electrode 86 and source electrode 88 (see FIG. 3D).

Next, the contact formation step will be described with reference to FIGS. 4A to 4D. The contact formation step includes sub-steps (k) to (n), which will be described hereinbelow. FIGS. 4A to 4D are step diagrams to illustrate the contact formation step.

In a sub-step (k), an interlayer insulating film 90 having a flat upper face, is formed on the SOI-MOSFET, that is, over the whole top side of the structure after the sub-step (j). The interlayer insulating film 90 is formed of a silicon oxide film by means of a CVD method, for example (see FIG. 4A).

In a sub-step (l), contact holes are provided above the second semiconductor layer of the element formation region corresponding to the part indicated by the reference numeral 32 in FIGS. 1 to 3 by photolithographically etching the interlayer insulating film 90. The contact holes are provided for the gate electrode 74, the drain electrode 86 and the source electrode 88. FIG. 4 shows, by way of example, a drain contact hole 96 provided above the drain electrode 86 and a source contact hole 98 provided above the source electrode 88. In addition, a substrate contact hole 92 is provided above the substrate contact region 12 by photolithographically etching the interlayer insulating film 90 and the element isolation insulating layer 52 (see FIG. 4B). The formation of the drain contact hole 96, the source contact hole 98, the gate contact hole (not shown) and the substrate contact hole 92 may be performed simultaneously depending on the design.

Figure 4A:
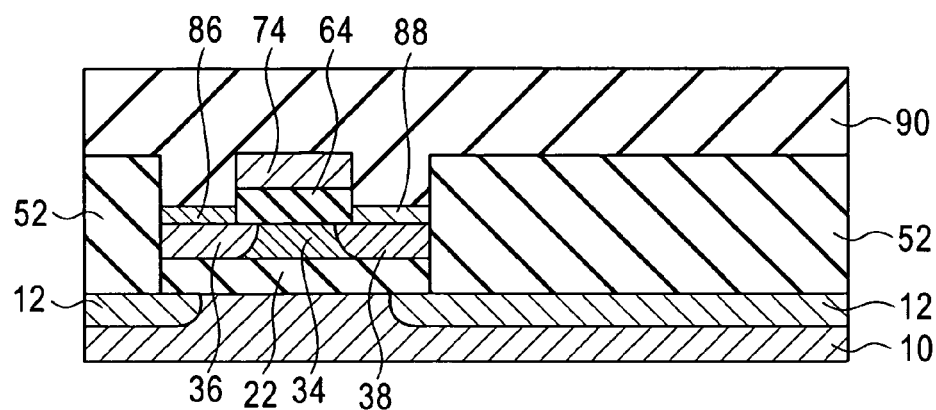
FIGS. 4A to 4D are step diagrams to illustrate a contact formation step.
Figure 4B:
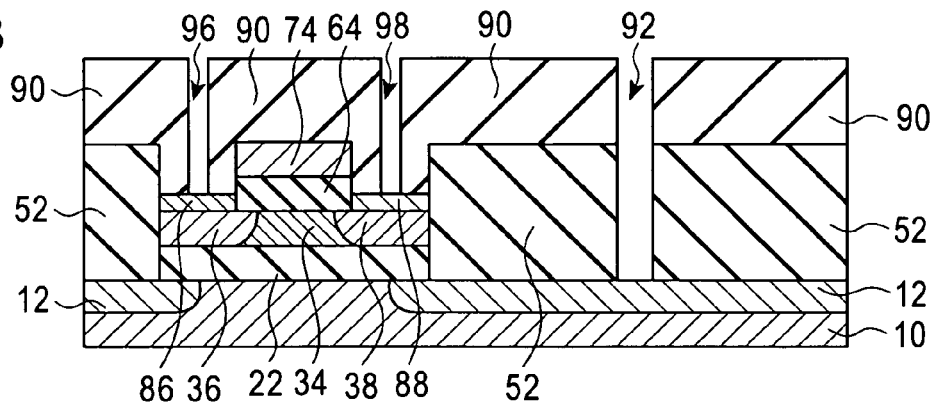
Figure 4C:
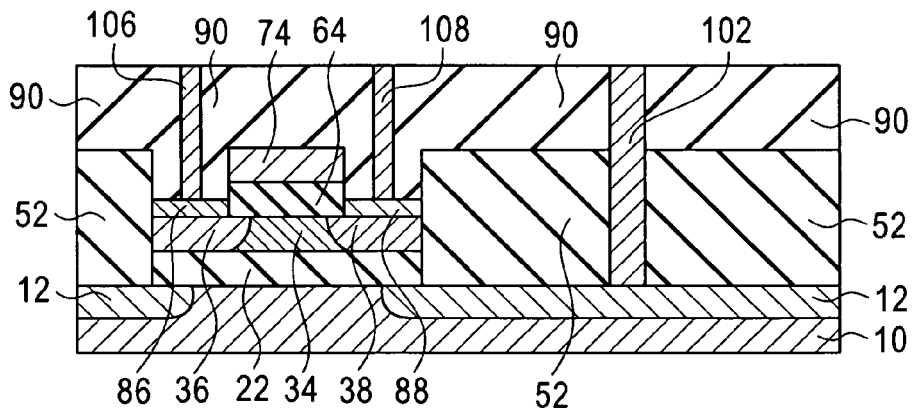

In a sub-step (m), the drain contact hole 96, the source contact hole 98, the gate contact hole (not shown), and the substrate contact hole 92 are filled with tungsten (W) by means of a CVD method, so as to form a gate plug (not shown), a drain plug 106, a source plug 108 and a substrate contact plug 102 (see FIG. 4C).

Figure 4D:
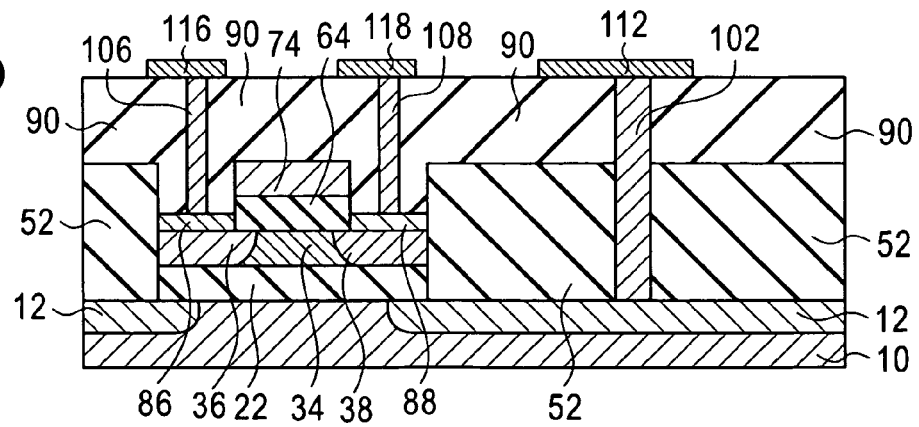
Figure 5A:
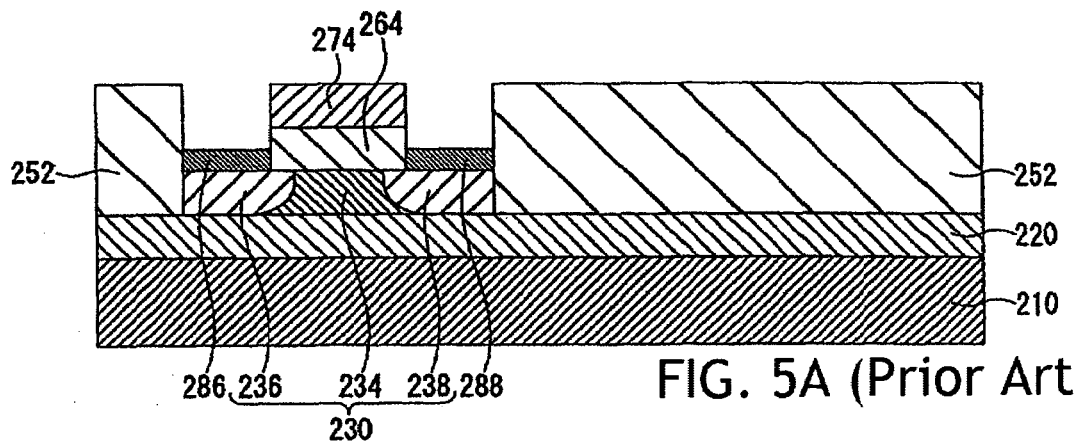
FIGS. 5A to 5C are step diagrams to illustrate a conventional substrate contact formation method (1)
Figure 5B:
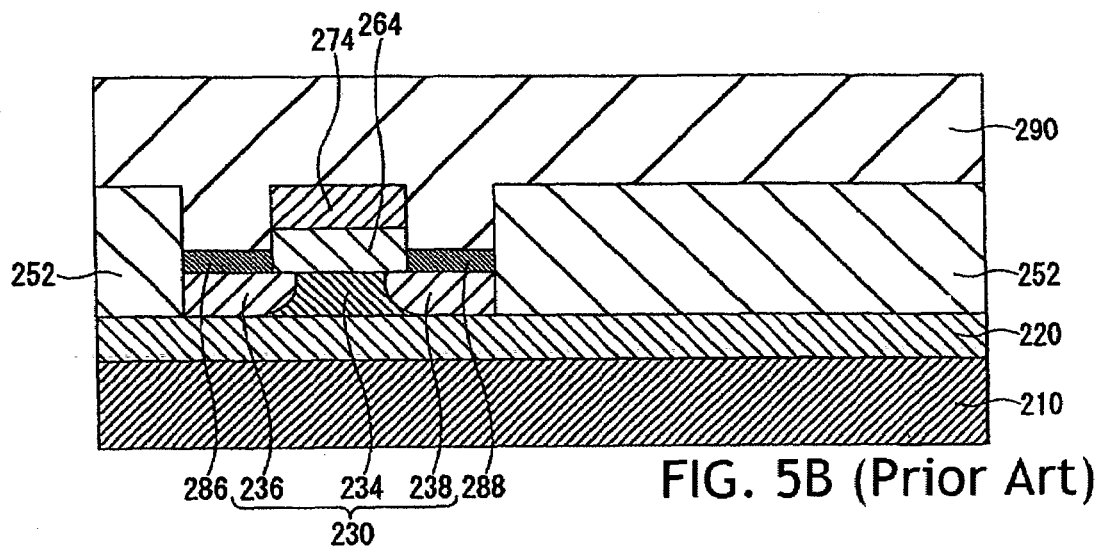
Figure 5C:
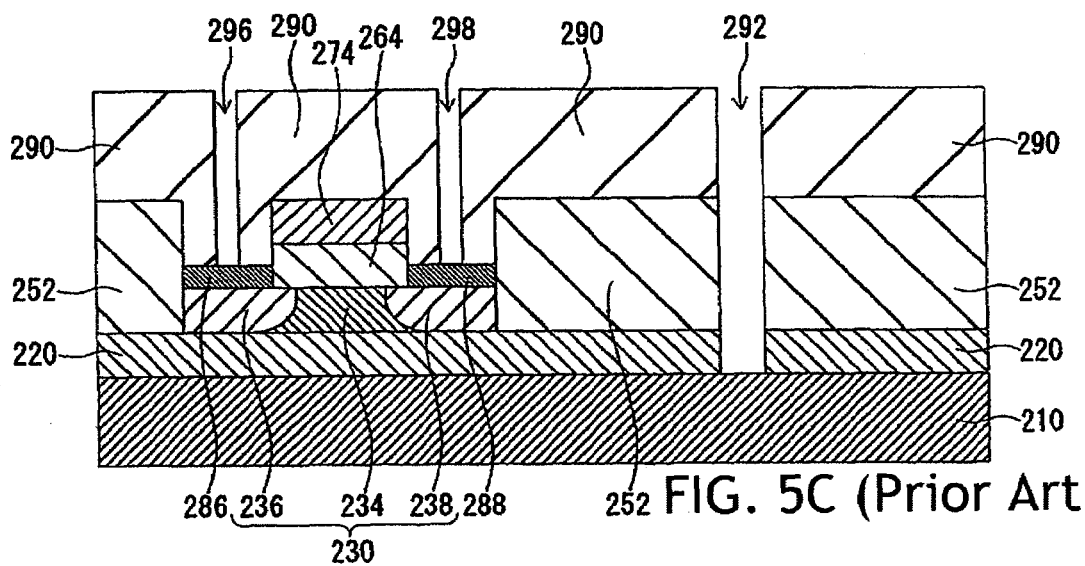
Figure 6A:
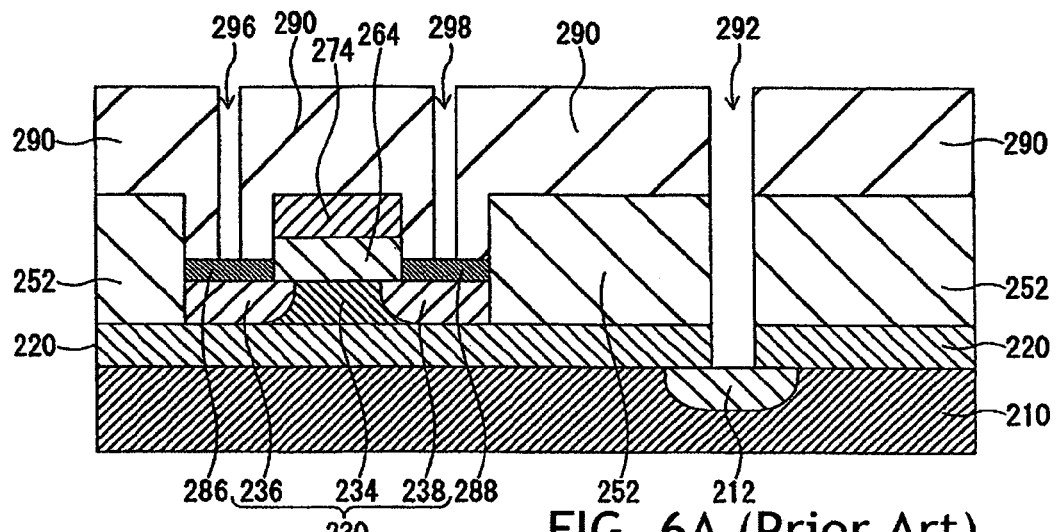
FIGS. 6A to 6C are step diagrams to illustrate a conventional substrate contact formation method (2).
Figure 6B:
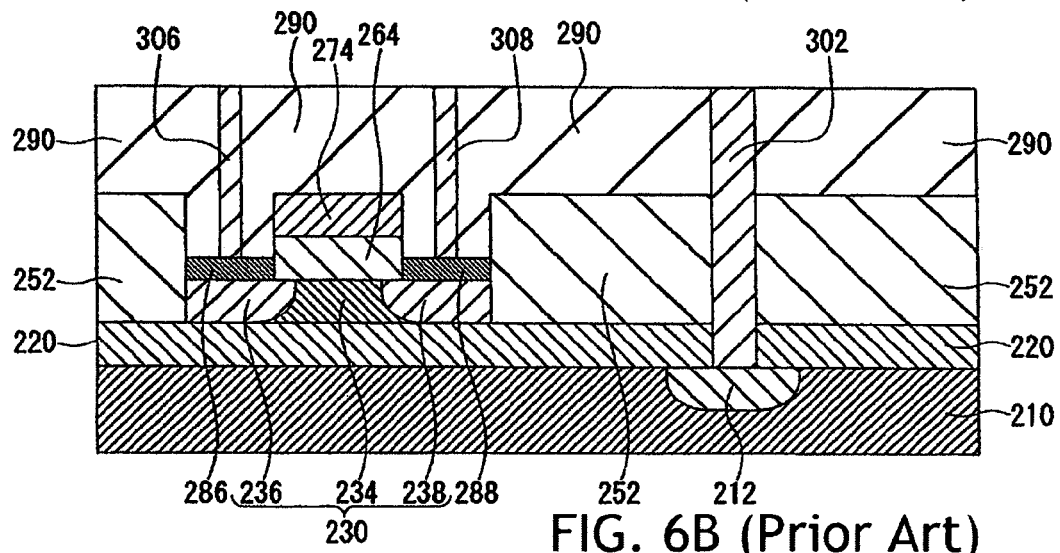
Figure 6C:
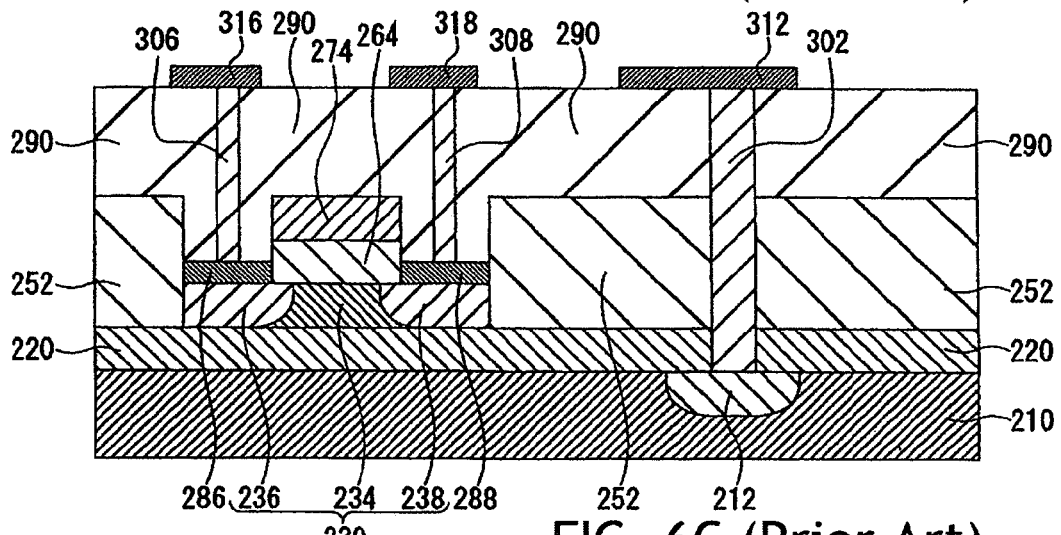

In a sub-step (n), metal (aluminum, for example) wiring is formed by a sputtering method on the interlayer insulating film 90 (see FIG. 4D). External connections are made by means of a drain wiring 116, a source wiring 118, a gate wiring (not shown) and a substrate wiring 112. Further, depending on the design, an insulating layer may be additionally provided on the interlayer insulating film 90 and a device provided with an MIM (Metal-Insulator-Metal) capacitor element or an inductor element may be used as the SOI device.

Although the formation of one MOSFET has been described in the above embodiment, the fabrication method of this invention can be applied to well-known SOI-CMOS formation methods.

According to the semiconductor device fabrication method of the invention, the trench etching to form an element isolation region is performed to the extent where the support substrate, i.e., the first semiconductor layer, is exposed and the impurity is introduced into the substrate contact region after the trench etching. Accordingly, it is possible to omit the step of providing an opening in an element isolation insulating layer for the introduction of the impurity into the substrate contact region.

Further, impurity is introduced into the substrate contact region before forming the drain electrode and the source electrode of the metal-silicide, and annealing to activate the substrate contact region can be performed simultaneously with the annealing to activate the drain and source regions. Therefore, adequate activation can be performed without causing metal-silicide aggregation or a phase transition to a high resistance phase during annealing, allowing the formation of a low-resistance substrate contact.

By applying the semiconductor device fabrication method of the invention to an SOI substrate, an SOI-CMOS formed with an adequately activated substrate contact region can be fabricated in the substrate contact region of the support substrate without substantially changing the conventional SOI-CMOS device formation process.

This application is based on a Japanese Patent Application No. 2004-033106 which is herein incorporated by reference.

What is claimed is:

1. A method of making a semiconductor device comprising:
   providing a layered substrate comprising a first semiconductor layer which forms a support substrate, an insulating layer provided on the first semiconductor layer, and a second semiconductor layer provided on the insulating layer;
   defining the layered substrate to have an element formation region, and an element isolation region that surrounds the element formation region;
   forming a mask on the second semiconductor layer to cover the element formation region, with the element isolation region remaining exposed;
   using the mask, etching the second semiconductor layer and the insulating layer in the element isolation region, to expose the support substrate in element isolation region, and to form a layered structure in the element formation region that includes a remaining insulating layer and a remaining second semiconductor layer;
   implanting ions to form a substrate contact region in the exposed support substrate in the element isolation region, while using the mask to prevent the ions from being implanted in the element formation region;
   after said implanting, forming an element isolation insulating layer directly on the exposed support substrate so as to surround the layered structure;
   removing the mask;
   after removing the mask, forming a gate oxide film and a gate electrode on the remaining second semiconductor layer;
   forming a drain region and a source region in the remaining second semiconductor layer by performing ion implantation with the gate electrode serving as a mask;
   annealing to simultaneously activate the substrate contact region, the drain region and the source region; and
   forming a metal layer with a high melting point on the drain and source regions and then siliciding the metal layer by performing heat treatment.

2. The semiconductor device fabrication method according to claim 1, wherein the second semiconductor layer is silicon and the layered substrate is an SOI substrate.

3. The semiconductor device fabrication method according to claim 2, wherein the 501 substrate is formed by using the SIMOX method.

4. The semiconductor device fabrication method according to claim 1, wherein the mask to cover the element formation region is formed by patterning a silicon nitride film.

5. The semiconductor device fabrication method according to claim 1, wherein the etching is performed by using reactive ion etching.

6. The semiconductor device fabrication method according to claim 1, wherein the ion-implanted impurity in the substrate contact region formation step is introduced at a density of about 1 to $5\times10^{15}$ ions/cm$^2$.

7. The semiconductor device fabrication method according to claim 1, wherein the ion-implanted impurity in the substrate contact region formation step is BF$_2$ or B when the substrate contact region is a p-type region and As or P when the substrate contact region is an n-type region.

8. The semiconductor device fabrication method according to claim 1, wherein the element isolation insulating layer is formed by depositing a silicon oxide film on the mask covering the element formation region and the exposed support substrate and then leveling the silicon oxide film by means of a polishing technique to a level where an upper face of the mask is exposed.

9. The semiconductor device fabrication method according to claim 8, wherein the silicon oxide film is formed by means of a CVD method.

10. The semiconductor device fabrication method according to claim 8, wherein the polishing technique is Chemical Mechanical Polishing.

11. The semiconductor device fabrication method according to claim 1, wherein in the gate electrode formation step, after the formation of a silicon oxide film by means of thermal oxidation and the formation of a polycrystalline silicon layer or metal by means of a CVD method, openings are formed in the drain formation region and the source formation region by etching with a mask of a resist pattern and then the gate oxide film and gate electrode are formed in a regional section interposed between the openings.

12. The semiconductor device fabrication method according to claim 11, wherein the metal is aluminum.

13. The semiconductor device fabrication method according to claim 1, wherein the ion-implanted impurity in the drain- and source-region formation step is $BF_2$ or B when a p-type region is formed and As or P when an n-type region is formed.

14. The semiconductor device fabrication method according to claim 1, wherein the annealing is performed with the substrate temperature at 1000° C. or more.

15. The semiconductor device fabrication method according to claim 1, wherein the semiconductor device fabrication method further comprises a contact formation step.

16. The semiconductor device fabrication method according to claim 15, wherein the contact formation step comprises the steps of:
   forming an interlayer insulating film having a flat upper face;
   providing contact holes above the second semiconductor layer of the element formation region and above the substrate contact region;
   forming plugs by filling the contact holes with tungsten; and
   forming metal wiring on the interlayer insulating film.

17. The semiconductor device fabrication method according to claim 15, further comprising a step of providing an insulating layer on the interlayer insulating film formed in the contact formation step.

18. The semiconductor device fabrication method according to claim 1, wherein the semiconductor device is a CMOS device.

19. The semiconductor device fabrication method according to claim 1, wherein the semiconductor device is an SOI-CMOS device.

20. The semiconductor device fabrication method according to claim 1, wherein the mask is removed from the element formation region after forming the element isolation insulating layer.

* * * * *